United States Patent
Zheng

(10) Patent No.: US 8,348,452 B2
(45) Date of Patent: Jan. 8, 2013

(54) SOLAR LED LAMP

(75) Inventor: Shi-Song Zheng, Shenzhen (CN)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 338 days.

(21) Appl. No.: 12/885,584

(22) Filed: Sep. 20, 2010

(65) Prior Publication Data

US 2011/0228523 A1 Sep. 22, 2011

(30) Foreign Application Priority Data

Mar. 19, 2010 (CN) .......................... 2010 1 0128339

(51) Int. Cl.
*F21L 4/02* (2006.01)
*F21L 4/06* (2006.01)
*F21V 29/00* (2006.01)

(52) U.S. Cl. .................................. 362/184; 362/249.02
(58) Field of Classification Search ............... 362/153.1, 362/145, 183, 184, 190, 249.02
See application file for complete search history.

(56) References Cited

U.S. PATENT DOCUMENTS

| 5,367,442 A * | 11/1994 | Frost et al. ..................... 362/183 |
| 6,406,163 B1 * | 6/2002 | Yang ............................. 362/183 |
| 2008/0074867 A1 * | 3/2008 | Chen ............................. 362/183 |

* cited by examiner

*Primary Examiner* — David V Bruce
(74) *Attorney, Agent, or Firm* — Altis Law Group, Inc.

(57) ABSTRACT

A solar LED lamp includes a housing, a light emitting module, a solar panel, and a light collective member. A circumference of the housing defines a plurality of windows. A light emitting module is received in the housing. Light rays emitted by the emitting module travel out of the housing via the plurality of windows. The solar panel absorbs solar energy and transfers the solar energy into electrical energy for the light emitting module. The light collective member is located over the solar panel and directs sunlight toward the solar panel.

18 Claims, 6 Drawing Sheets

SOLAR LED LAMP

BACKGROUND

1. Technical Field

The present invention relates to a solar LED lamp, and more particularly to a solar LED lamp which utilizes a solar energy to drive an LED lamp.

2. Description of Related Art

LED (light emitting diode) lamps are highly energy efficient electrical light sources, and are increasingly being considered for indoor or outdoor lighting purposes. An LED lamp assembly comprises an LED lamp and an electric source for driving the LED lamp. When the LED lamp assembly works, electrical energy is consumed. However, such LED lamp assembly cannot be used in some districts such as a district deep in the mountains or deserts where it is difficult to obtain domestic electric power.

What is needed, therefore, is a solar LED lamp which can overcome the above-mentioned disadvantages.

DETAILED DESCRIPTION

Figure 1:
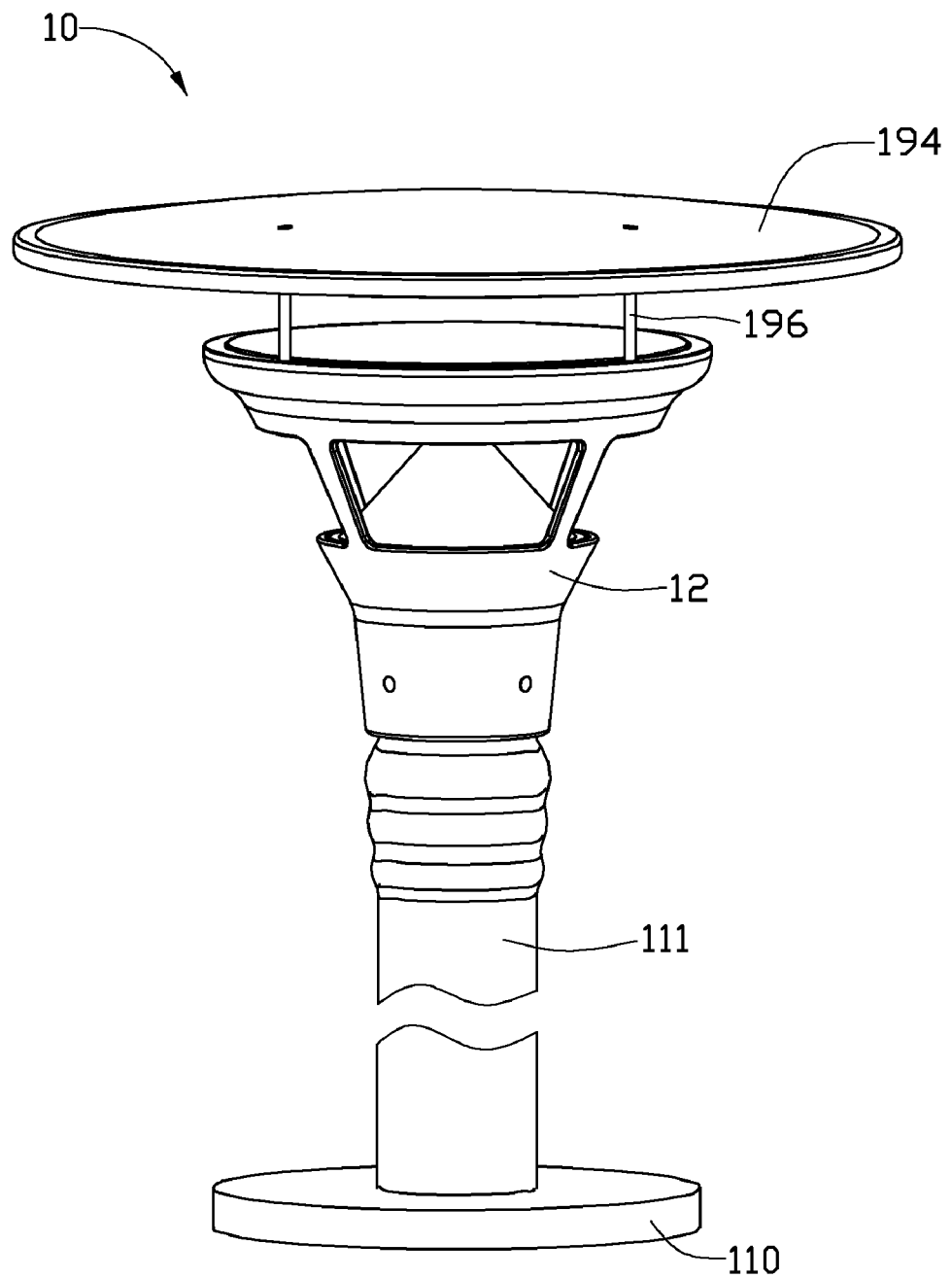
FIG. 1 is an assembled and isometric view of a solar LED lamp in accordance with an embodiment of the present disclosure.
Figure 2:
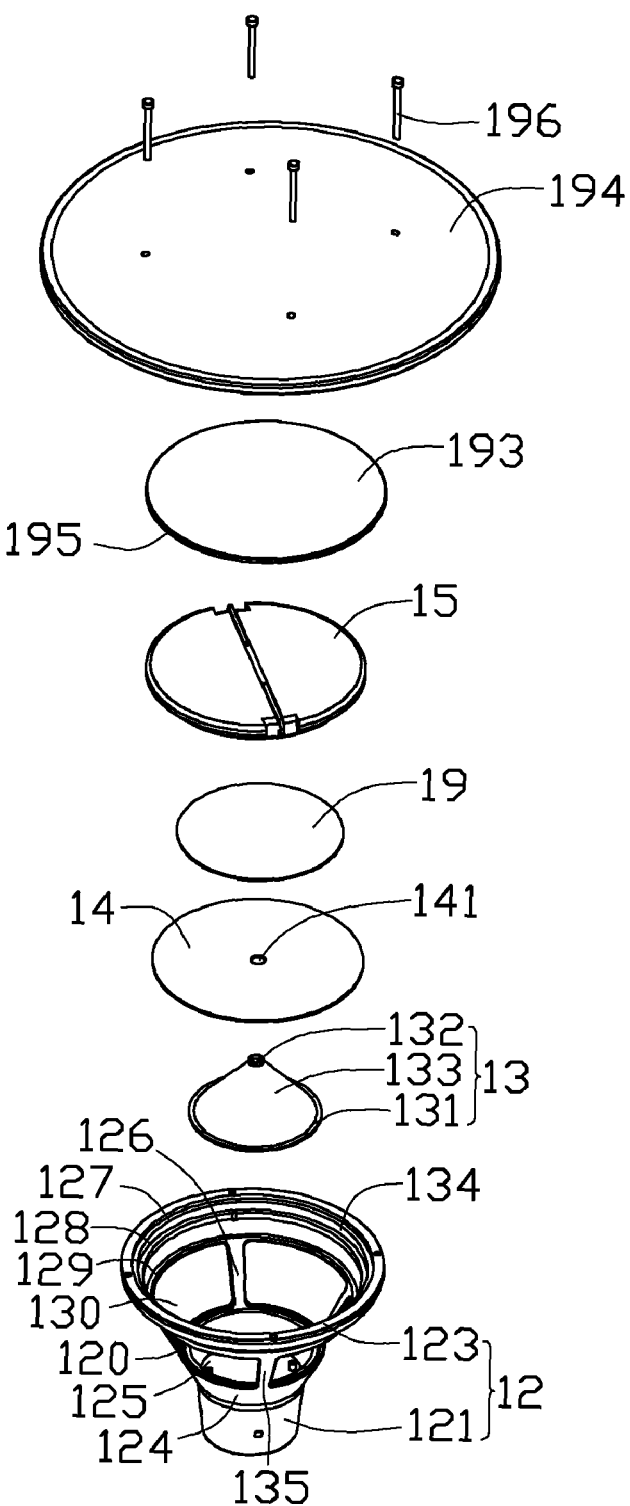
FIG. 2 is an exploded view of the solar lamp of FIG. 1, with a base and a fixing member thereof being omitted.
Figure 3:
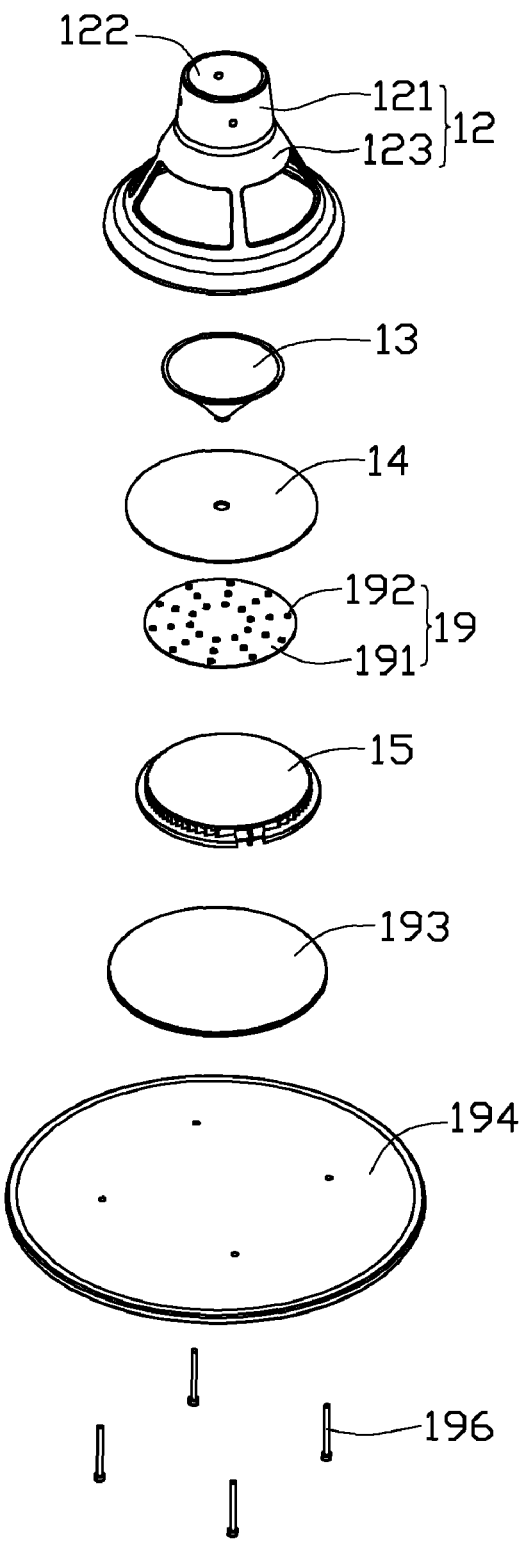
FIG. 3 is an exploded view of the solar lamp of FIG. 2, viewed from another aspect.

FIGS. 1-3 show a solar LED lamp 10 including a base 110, a fixing member 111, a housing 12, a reflector 13, a cover 14, a light emitting module 19, a heat dissipating module 15, a solar panel 193 and a light collective member 194. The base 110 is disc-shaped and located at a bottom of the solar LED lamp 10 thereby supporting the solar LED lamp 10 at a desired place. The fixing member 111 is cylindrical and extends upward from the base 110 thereby holding the housing 12 at a working position above the base 110.

The housing 12 is made of heat conductive material, for example aluminum. The housing 12 includes a mounting portion 121 at a bottom thereof and a receiving portion 123 extending upwardly from the mounting portion 121. The mounting portion 121 has a cylindrical configuration and defines a central mounting hole 122 therein. A top end of the fixing member 111 is inserted into the mounting hole 122 of the mounting portion 121 whereby the housing 12 is connected with the fixing member 111.

The receiving portion 123 is cup-shaped and has an opening 134 at a top side thereof. The receiving portion 123 defines a receiving room 130 therein. The reflector 13, the cover 14, the light emitting module 19, the heat dissipating module 15 and the solar panel 193 are coaxially received in the receiving room 130 in sequence. A circumference 124 of the housing 12 symmetrically defines four windows 125. Every two adjacent windows 125 are separated by a bar 135. An inner wall 126 of the receiving portion 123 forms a first step 127, a second step 128, a third step 129 and a fourth step 120 from top to bottom, which are annual and spaced from each other. The windows 125 are sandwiched between the third step 129 and the fourth step 120. Diameters of the annular steps 127, 128, 129, 120 are gradually decreased along the top-to-bottom direction.

The reflector 13 is hollow and cone-shaped in profile with a tip at a top thereof. An outer circumference 133 of the reflector 13 downwardly enlarges. A flange 131 extends radially and outwardly from a bottom side of the reflector 13. A cylindrical protrusion 132 extends upwardly and vertically from a top side of the reflector 13.

The cover 14 is disc-shaped in profile and made of semi-transparent or transparent material. The cover 14 defines a through hole 141 at a center thereof.

Figure 4:
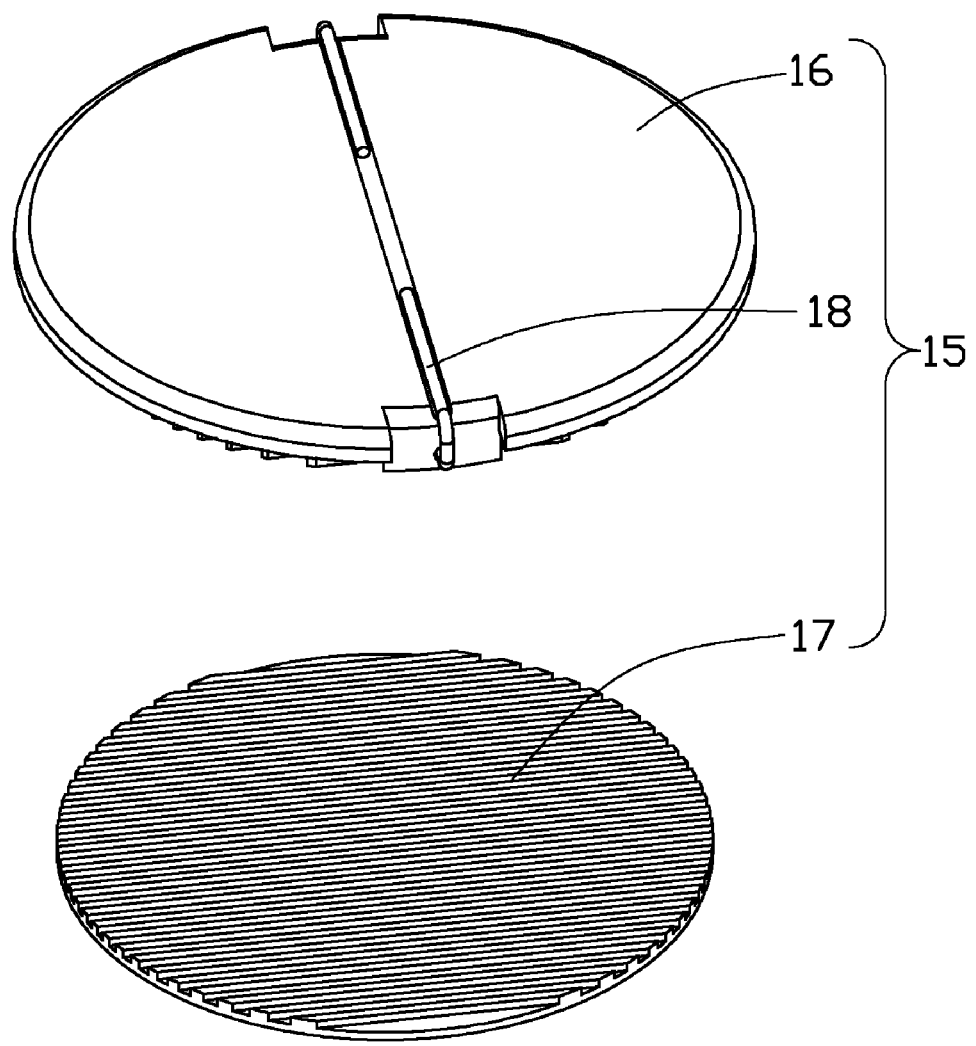
FIG. 4 is an exploded view of a heat dissipating module of FIG. 2.
Figure 5:
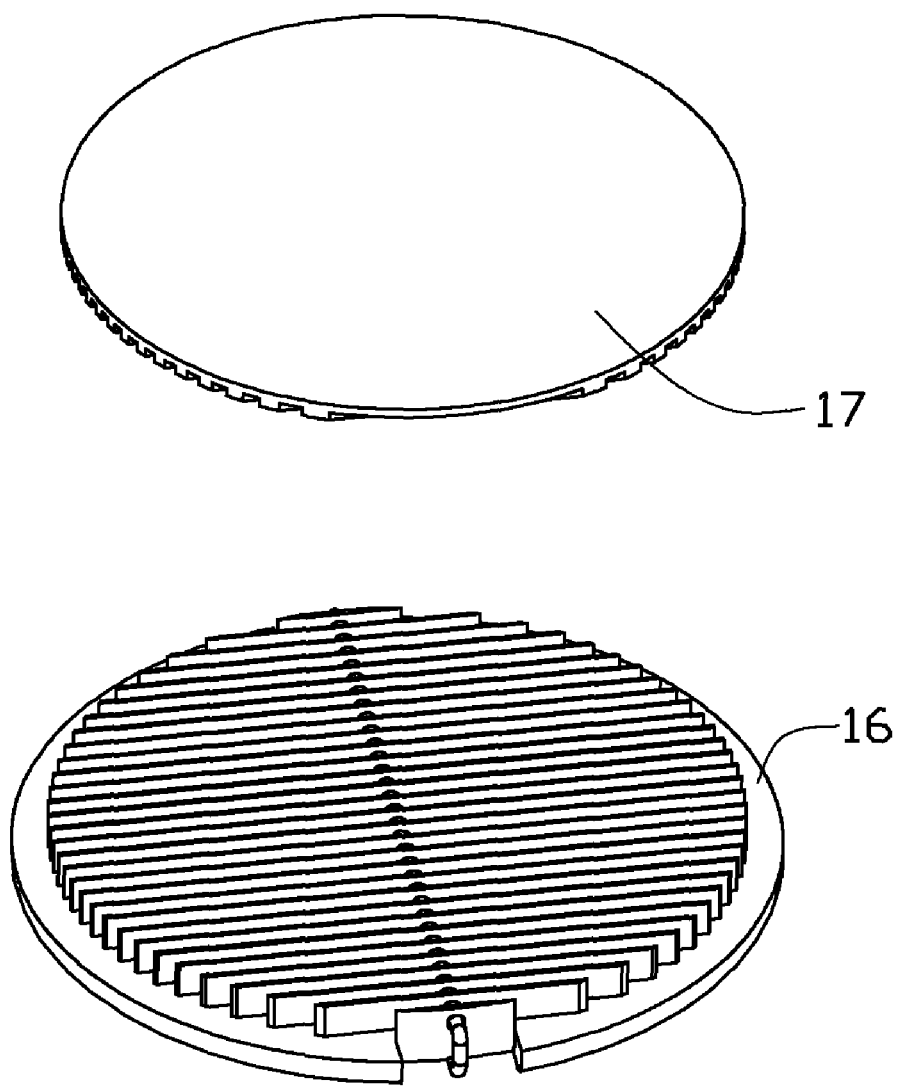
FIG. 5 is an exploded view of the heat dissipating module of FIG. 2, viewed from another aspect.
Figure 6:
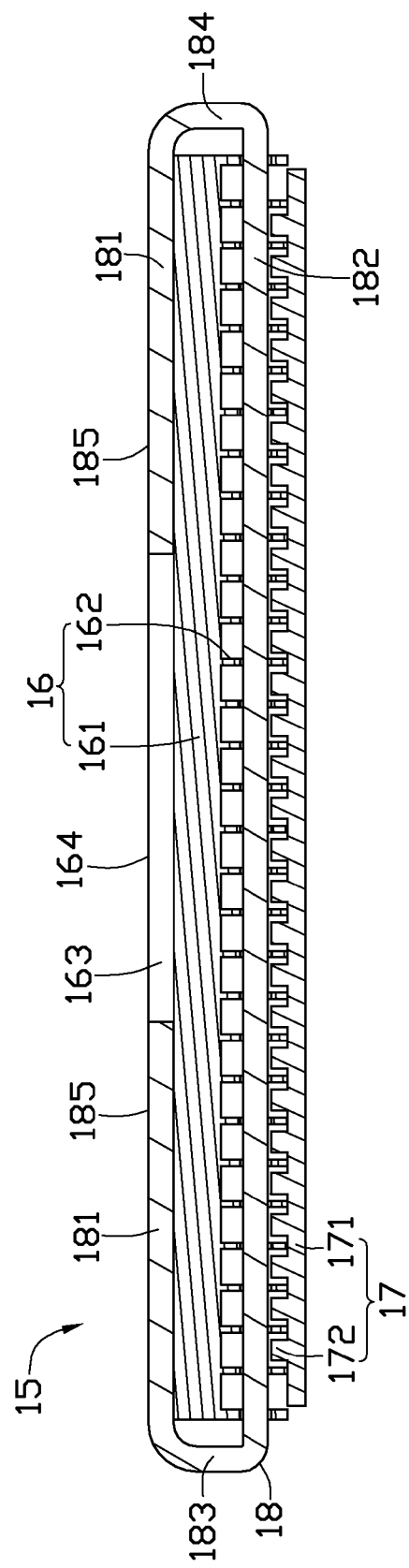
FIG. 6 is a cross-sectional view of the heat dissipating module of FIG. 2.

Referring also to FIGS. 4-6, the heat dissipating module 15 includes a first heat sink 16, a second heat sink 17 and a heat pipe 18. The first heat sink 16 is located at a top side of the heat dissipating module 15. The first heat sink 16 includes a first plate 161 and a plurality of first fins 162 extending downwardly from the first plate 161. The first plate 161 is disc-shaped and a top surface 164 of the first plate 161 defines a receiving groove 163.

The second heat sink 17 is located at a bottom side of the first heat sink 16 and connected with the first heat sink 16 via a plurality of screws (not shown). The second heat sink 17 includes a second plate 171 and a plurality of second fins 172 extending upwardly from the second plate 171 toward the first plate 161. The second plate 171 is disc-shaped and has a smaller diameter than the first plate 161 of the first heat sink 16. The plurality of first fins 162 and second fins 172 are parallel and interlaced. Each of the plurality of second fins 172 is located between two adjacent first fins 162. The plurality of first fins 162 rest on the second plate 171 of the second heat sink 17. The plurality of second fins 172 are spaced from the first plate 161 of the first heat sink 16, thereby defining a plurality of horizontal channels between the first and the second heat sinks 16, 17.

The heat pipe 18 is curved and includes two evaporator sections 181, a condenser section 182, a first connecting section 183 and a second connecting section 184. The two evaporator sections 181 are flat and opposite to each other along a diametrical direction of the first heat sink 16. The two evaporator sections 181 are received in the receiving groove 163 of the first plate 161 of the first heat sink 16. An outer circumference 133 of each evaporator section 181 has a flat surface coplanar with the top surface 164 of the first heat sink 16. The condenser section 182 extends horizontally through the plurality of first fins 162. The first connecting section 183 and the second connecting section 184 are connected between the two evaporator sections 181 and the condenser section 182, respectively. The condenser section 182 is located directly below the evaporator sections 181.

The light emitting module 19 includes a PCB 191 (printed circuit board) and a plurality of LEDs 192. The plurality of LEDs 192 are arranged on the PCB 191. The PCB 191 of the light emitting module 19 is located under the second heat sink 17 and attached on the second plate 171 of the second heat sink 17.

The solar panel 193 is disc-shaped. The solar panel 193 absorbs solar energy and transfers the solar energy into electrical energy for the light emitting module 19. The solar panel 193 is mounted on the first step 127 of the housing 12 and seals the opening 134 of the receiving portion 123 of the housing 12. A bottom surface of the solar panel 193 is attached on the top surface 164 of the first heat sink 16 and the flat surface 185 of each of the two evaporator sections 181.

The light collective member 194 is a lens. The light collective member 194 is located over the housing 12 and spaced from the solar panel 193 to direct sunlight onto the solar panel 193. The light collective member 194 is connected with the housing 12 via four supporting members 196. The light collective member 194 has a greater diameter than that of the solar panel 193 and completely covers the solar panel 193 whereby the light collective member 194 directs more sunlight toward the solar panel 193 and the collected sunlight is evenly distributed on the solar panel 193.

In assembly of the solar LED lamp 10, the flange 131 of the reflector 13 is mounted on the fourth step 120 of the housing 12. The cover 14 is mounted on the third step 129 of the housing 12, and the protrusion 132 of the reflector 13 is inserted into the through hole 141 of the cover 14. The first plate 161 of the first heat sink 16 is mounted on the second step 128 of the housing 12 and the plurality of LEDs 192 of the light emitting module 19 faces the cover 14, whereby the heat dissipating module 15 and the light emitting module 19 are fixed in the receiving portion 123 of the housing 12. In other words, the cover 14 is located between the light emitting module 19 and the reflector 13 and the reflector 13 is located under the cover 14. The reflector 13 faces the light emitting module 19 and a center of the reflector 13 is coaxially aligned with a center of the light emitting module 19.

In use, the sunlight is directed to the solar panel 193 via the light collective member 194, and the solar panel 193 converts solar energy into electrical energy for the LEDS 192. Meanwhile, heat generated by the solar panel 193 is transferred to the housing 12 via the first heat sink 16 and the heat pipe 18.

The light emitting module 19 emits light rays and the light rays travel downwardly toward the cover 14. After the light rays pass through the cover 14, the light rays continue to travel toward the reflector 13. The light rays are reflected by the reflector 13 and redirected out of the housing 12 via the windows 125. Heat generated by the light emitting module 19 is transferred to the housing 12 via the second heat sink 17 and the first heat sink 16 and dissipated into the outer atmosphere via the housing 12.

It is to be understood, however, that even though numerous characteristics and advantages of the disclosure have been set forth in the foregoing description, together with details of the structures and functions of the embodiment(s), the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A solar LED lamp, comprising:
   a housing, a circumference of the housing defining a plurality of windows;
   a light emitting module received in the housing, light rays generated by the light emitting module emitting out of the housing via the plurality of windows;
   a solar panel absorbing solar energy and transferring the solar energy into electrical energy for the light emitting module; and
   a light collective member located corresponding to the solar panel and directing sunlight toward the solar panel.

2. The solar LED lamp of claim 1 further comprising a reflector received in the housing, the reflector facing the light emitting module and directing the light rays generated by the light emitting module out of the housing.

3. The solar LED lamp of claim 2, wherein a center of the reflector is coaxially aligned with a center of the light emitting module and an outer circumference of the reflector downwardly enlarges, the light emitting module being located above the reflector.

4. The solar LED lamp of claim 2 further comprising a cover located between the light emitting module and the reflector, and the reflector being located under the cover.

5. The solar LED lamp of claim 1 further comprising a first heat sink located under the solar panel, the first heat sink comprising a first plate and a plurality of first fins, the first plate being attached under the solar panel, the plurality of first fins extending from the first plate toward the light emitting module.

6. The solar LED lamp of claim 5 further comprising a heat pipe, the heat pipe comprising at least one evaporator section and a condenser section, the at least one evaporator section being received in the first plate, the condenser section extending through the plurality of first fins.

7. The solar LED lamp of claim 5 further comprising a second heat sink located on the light emitting module, the second heat sink comprising a second plate and a plurality of second fins, the second plate being attached on the light emitting module, the plurality of second fins extending from the second plate toward the first heat sink.

8. The solar LED lamp of claim 7, wherein the plurality of first fins and the plurality of second fins are parallel and interlaced.

9. The solar LED lamp of claim 8, wherein each of the plurality of first fins is located between two adjacent second fins.

10. The solar LED lamp of claim 1, wherein the light emitting module comprising a PCB and a plurality of LEDs, and the plurality of LEDs are arranged on the PCB.

11. A solar LED lamp, comprising:
    a housing;
    a light emitting module received in the housing, light rays generated by the light emitting module emitting out of the housing;
    a solar panel absorbing solar energy and transferring the solar energy into electrical energy for the light emitting module;
    a first heat sink located under the solar panel, the first heat sink comprising a first plate attached under the solar panel and a plurality of first fins extending from the first plate toward the light emitting module; and
    a second heat sink located on the light emitting module, the second heat sink comprising a second plate attached on the light emitting module and a plurality of second fins extending from the second plate toward the first heat sink.

12. The solar LED lamp of claim 11, wherein the plurality of first fins and the plurality of second fins are parallel and interlaced.

13. The solar LED lamp of claim 11, wherein the plurality of first fins rest on the second plate of the second heat sink, the plurality of second fins are spaced from the first plate of the first heat sink.

14. The solar LED lamp of claim 11 further comprising a heat pipe, the heat pipe comprising at least one evaporator section and a condenser section, the at least one evaporator section being received in the first plate, the condenser section extending through the plurality of first fins.

15. The solar LED lamp of claim 11 further comprising a reflector received in the housing, the reflector facing the light emitting module and directing the light rays generated by the light emitting module out of the housing.

16. The solar LED lamp of claim 14, wherein a center of the reflector is coaxially aligned with a center of the light emitting module and an outer circumference of the reflector downwardly enlarges, the light emitting module being located above the reflector.

17. The solar LED lamp of claim 14 further comprising a cover located between the light emitting module and the reflector, and the reflector being located under the cover.

18. The solar LED lamp of claim 11, wherein a circumference of the housing defines a plurality of windows, and the light rays generated by the emitting module emit out of the housing via the plurality of windows.

* * * * *